United States Patent
LeBeau et al.

[11] Patent Number: 6,009,187
[45] Date of Patent: Dec. 28, 1999

[54] WAFER PROBER HAVING AN EMISSIVE DISPLAY INSPECTION SYSTEM AND METHOD OF USE

[75] Inventors: Christopher J. LeBeau; David C. Lehnen; Scott R. Novis, all of Tempe; Anthony Angelo, Gilbert, all of Ariz.

[73] Assignee: Motorola, Inc., Schaumburg, Ill.

[21] Appl. No.: 08/758,509

[22] Filed: Dec. 2, 1996

[51] Int. Cl.⁶ .................................................. G06K 9/00
[52] U.S. Cl. .................. 382/145; 382/141; 382/144; 382/284
[58] Field of Search .................. 382/141, 145, 382/284

[56] References Cited

U.S. PATENT DOCUMENTS

| | | | |
|---|---|---|---|
| 3,702,410 | 11/1972 | Miyashiro et al. | 313/367 |
| 3,742,631 | 7/1973 | Hasala | 40/36 |
| 4,875,005 | 10/1989 | Terada et al. | 324/754 |
| 4,950,982 | 8/1990 | Obikane et al. | 324/754 |
| 5,081,687 | 1/1992 | Henley et al. | 382/57 |
| 5,394,481 | 2/1995 | Kumagai et al. | 382/48 |
| 5,539,676 | 7/1996 | Yamaguchi | 382/151 |
| 5,559,894 | 9/1996 | Lubliner et al. | 382/1 |
| 5,644,331 | 7/1997 | Hazama | 345/98 |
| 5,673,331 | 9/1997 | Lewis et al. | 382/100 |
| 5,686,960 | 11/1997 | Sussman et al. | 348/218 |
| 5,691,764 | 11/1997 | Takekoshi et al. | 348/86 |
| 5,742,173 | 4/1998 | Nakagomi et al. | 324/758 |

*Primary Examiner*—Christopher S. Kelley
*Assistant Examiner*—Sheela Chawan
*Attorney, Agent, or Firm*—Rennie William Dover; Kenneth M. Seddon

[57] ABSTRACT

An inspection system (20) has an image capture device (10) that is mounted onto a wafer prober (15) for the electrical verification of electronic components (60) having an emissive display (61). The image capture device (10) includes a lens (31) that collects the image generated by the emissive display (61). The image is passed to mirrors (36,37) which redirect a portion of the image into a pickup device (41). The emissive display (61) is partitioned into subregions (62–65) to facilitate the capturing of the image. As the image of each of the subregions (62–65) is collected by image capture device (10), the other subregions (62–65) are deactivated.

8 Claims, 3 Drawing Sheets

WAFER PROBER HAVING AN EMISSIVE DISPLAY INSPECTION SYSTEM AND METHOD OF USE

BACKGROUND OF THE INVENTION

This invention relates, in general, to electronic components and, more particularly, to apparatuses for inspecting electronic components that have an emissive display.

A new generation of electronic components combines an integrated circuit with an emissive display. These electronic components are used in a variety of applications such as wireless communication devices. For example, an emissive display can be used on a paging device to display information sent to the person holding the paging device. The emissive display typically consists of a sequence of individual pixels that are arranged in an array. Each pixel has a varying intensity and represents a dot in the emissive display. Preferably, each pixel can be generated by a light emitting diode (LED) or similar device.

One problem with the fabrication of electronic components that have emissive displays arises in the final testing process. Before the electronic component is sent to a customer, the electronic component must be tested to verify that each pixel in the emissive display is operating properly. This is generally done by placing the electronic component under a camera that has a resolution, which is equal to or greater than the resolution of the emissive display. A sequence of known test patterns is then generated in the emissive display. The patterns of the emissive display are captured by the camera and analyzed to determine if the captured image of the emissive display matches the known pattern.

As technology evolves, the density of pixels in emissive displays generally increases. To accurately capture an image generated by an emissive display, the resolution of the camera must also be improved. This is typically done by upgrading the camera in the testing apparatus with a more expensive camera that has the required resolution.

Hence, a need exists to provide an inspection system that can be used on emissive displays that have varying resolutions. It would be advantageous if the inspection system did not require replacement of a camera as the resolution of the emissive displays varies and could be used to test emissive displays that are of different sizes or configurations.

Figure 1:
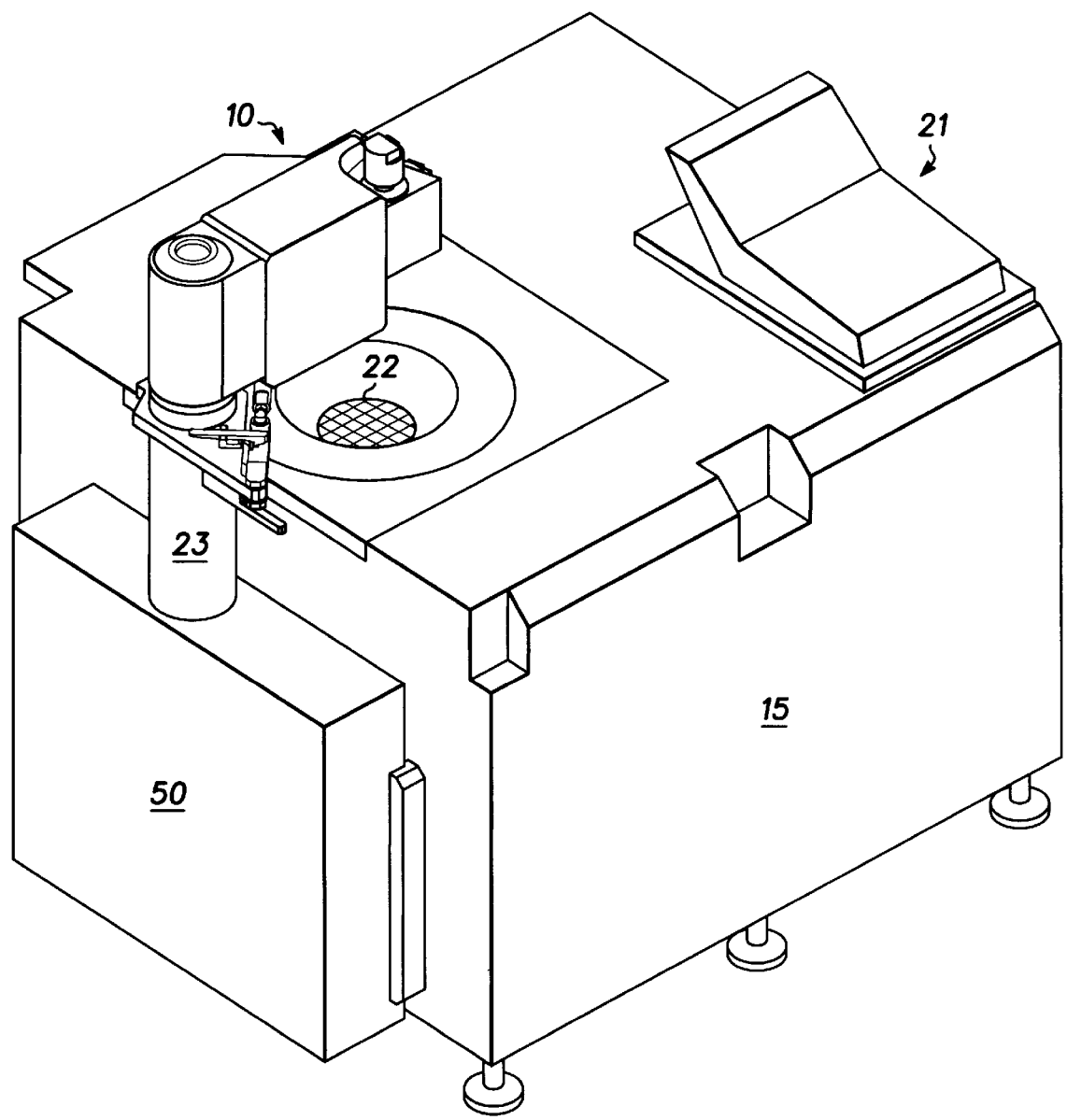
FIG. 1 is a reduced isometric view of an inspection system in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is a reduced isometric view of an inspection system 20 that is used to test electronic components having an emissive display. Inspection system 20 includes a wafer prober 15 such as any wafer handler commonly used in the semiconductor industry. Wafer prober 15 positions and stores individual wafers as they undergo an electrical testing process. This testing process verifies the electrical performance of the electronic components while the electronic components are still in wafer form. Wafer prober 15 is operated by a control panel 21 that is used to specify the type of wafers loaded into wafer prober 15 and the test program that is to be used for the testing process. A wafer 22 is shown in FIG. 1, which contains a plurality of electronic components, each having at least one emissive display in accordance with the present invention.

Inspection system 20 also includes an image capture device 10 that mounts to wafer prober 15 by a post 23 or some other suitable means. A control device 50 controls the operation of image capture device 10 during the testing operation. Control device 50 also controls the operation of the electronic components being tested by passing control signals to the individual electronic components on wafer 22. The control signals are generated by control device 50 and are passed to the device under test (DUT) through wafer prober 15 to activate the emissive display of each component. Image capture device 10 captures the images generated by each individual emissive display that is on wafer 22. A more detailed description of how the images are captured will be provided shortly.

Figure 2:
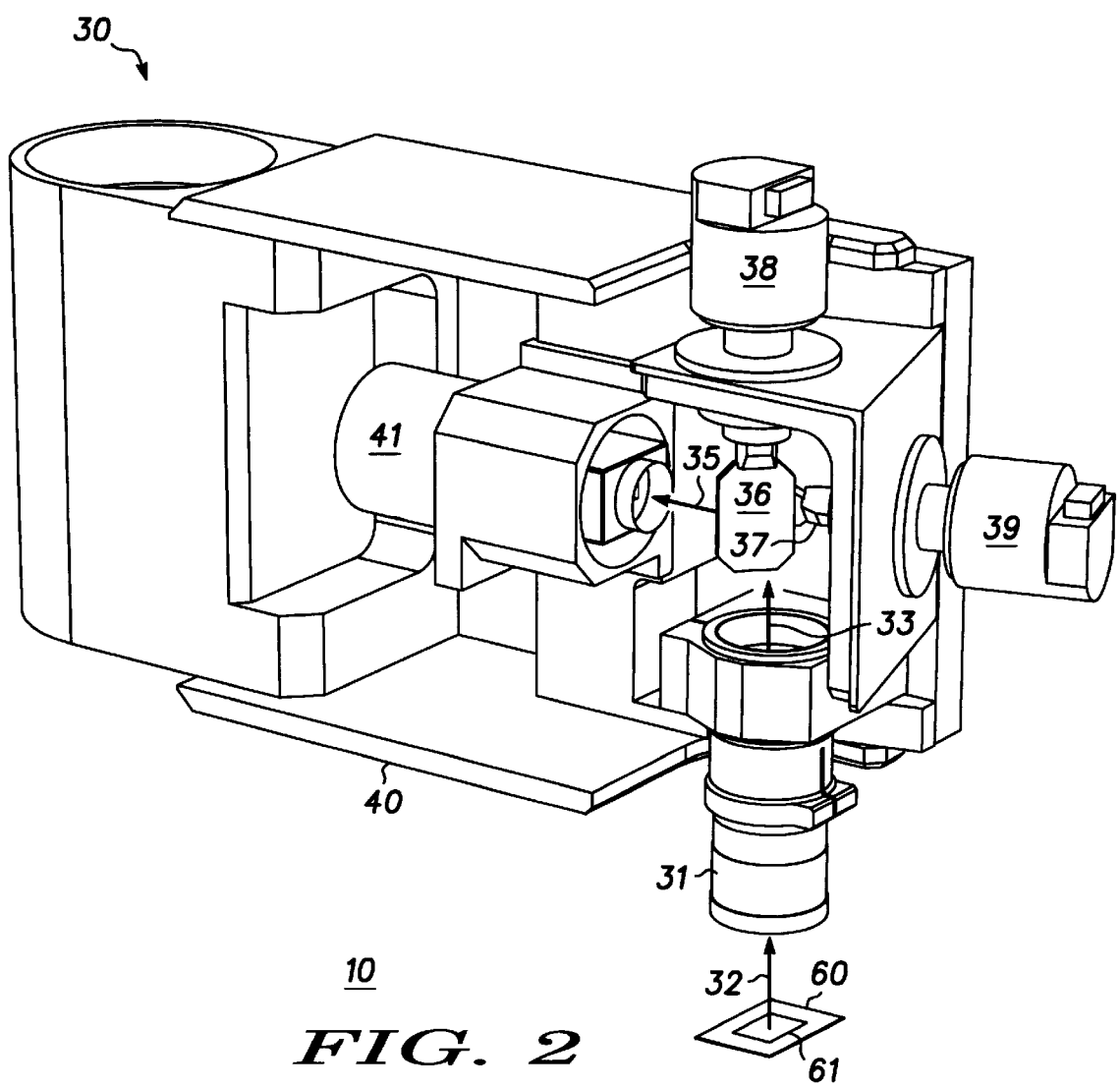
FIG. 2 is a magnified view of a portion of the inspection system illustrated in FIG. 1.

FIG. 2 is an isometric view of image capture device 10. The image (indicated in FIG. 2 by an arrow 32) generated by an emissive display 61 on an electronic component 60 first passes through a lens 31. Lens 31 is a photographic enlarger lens that has a flat field and a high resolution.

After the image passes through lens 31 (indicated in FIG. 2 by an arrow 33), it is directed towards mirrors 36 and 37. Mirrors 36 and 37 are positioned or tilted by mirror controls 38 and 39, respectively. Mirror controls 38 and 39 can be servo motors, galvanometers, electrical actuators, pneumatic actuators, or hydraulic actuators. Mirror controls 38 and 39 are used to select the portion of the image coming out of lens 31 (arrow 33) that is to be redirected into a pickup device 41. In other words, not all of the image generated by emissive display 61 is redirected towards pickup device 41. Instead, mirrors 36 and 37 are rotated to select only the portion of the image generated by emissive display 61 and lens 31 that is to be captured by pickup device 41. Control signals are sent to mirror controls 38 and 39 to position mirrors 36 and 37, respectively, to select the portion of the image that is to be captured.

The selected image (indicated in FIG. 2 by an arrow 35) is then captured by pickup device 41. Preferably, pickup device 41 operates using industry defined standards such as the RS170 standard. For example, pickup device 41 can be a solid state charge coupled device (CCD) style camera. Such cameras have low noise, geometric linearity that is constant across the array, and are sensitive to the wave lengths generated by emissive display 61.

Lens 31, mirrors 36 and 37, and pickup device 41 are all mounted to a body 40 to provide image capture device 10. Image capture device 10 also has a hole 30 that is used to mount body 40 to wafer prober 15.

Figure 3:
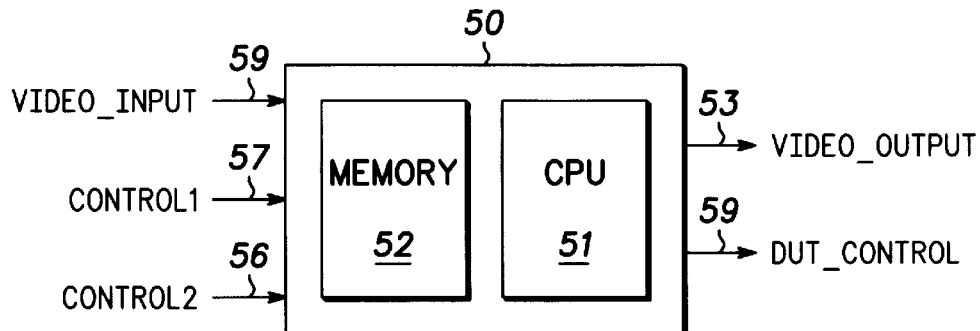
FIG. 3 is a block diagram representation of another portion of the inspection system illustrated in FIG. 1.

FIG. 3 is a block diagram of the control device 50 used to control the operation of image capture device 10 of FIG. 2. Control device 50 has two control lines 56 and 57 that provide control signals to mirror controls 38 and 39 (see FIG. 2). These control signals are labeled in FIG. 3 as CONTROL1 and CONTROL2 and are used to direct the position of mirror controls 38 and 39, respectively. Control device 50 has a control line 59, labeled DUT_CONTROL, which is used to pass the necessary signals to the electronic component under test and operate the emissive display as needed. Control device 50 also has an input line 58, which is labeled VIDEO_INPUT in FIG. 3. VIDEO_INPUT represents the image (FIG. 2, arrow 35) from the emissive display under test that is captured by pickup device 41.

Due to the possibility of noise in either image capture device 10 or the image generated by emissive display 61 (see FIG. 2), signal processing is performed to ensure that an accurate image is captured. This signal processing is performed by a microprocessor or microcontroller that typically has a central processing unit (CPU) 51 and a memory 52 that is either external or internal to CPU 51.

Each image that is captured by pickup device 41 is an array of pixels. For purposes of illustration, the array of pixels is arranged in "I" rows and "J" columns, where "I" and "J" are integers. Therefore, each pixel can be identified as $P_{I,J}$ corresponding to the pixel in the Ith row and Jth column. Each pixel ($P_{I,J}$) has an light intensity value labeled $I_{I,J}$ at each pixel location.

In the preferred embodiment, it is assumed that noise is dark and thus has a low intensity value. To generate the image that is captured by image capture device 10 (see FIG. 2), several images (1 to n, where n is an integer) are stored in memory 52 and a composite image is generated by CPU 51 on a pixel by pixel basis from the stored images. Each pixel in the composite image is assigned the intensity value of the largest intensity value ($I_{I,J}$) of all the images at the same location. Thus, each pixel in the composite image is determined by the expression:

$$(P_{I,J}) = MAX(Image_1(P_{I,J}), Image_2(P_{I,J}), \ldots, or\ Image_n(P_{I,J}))$$

It should also be understood that image capture device 10 can operate where noise has the brightest intensity. In this case then, each pixel would be the minimum intensity value of from all the images:

$$(P_{I,J}) = MIN(Image_1(P_{I,J}), Image_2(P_{I,J}), \ldots, or\ Image_n(P_{I,J}))$$

Once a composite image is generated, control device 50 uses an output line 53 to pass the image, labeled in FIG. 3 as VIDEO_OUTPUT, back to inspection system 20. Inspection system 20 performs a comparison of the captured image to a predicted or known image to determine if the emissive display currently under evaluation is operating properly.

Figure 4:
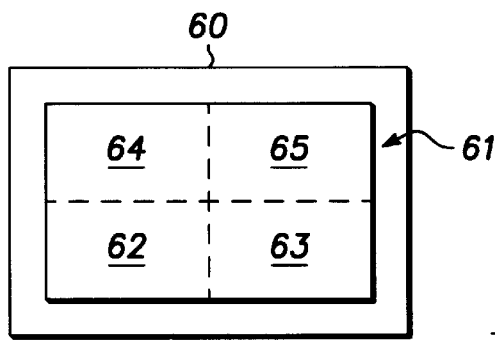
FIG. 4 is an enlarged top view of an electronic component.

FIG. 4 is an enlarged top view of electronic component 60 and is provided to illustrate an example of how emissive display 61 is tested in accordance with the present invention. Emissive display 61 is divided into subregions, namely subregion 62, subregion 63, subregion 64, and subregion 65. Each subregion 62–65 represents a portion of emissive display 61 that is captured by image capture device 10. Preferably, emissive display 61 is partitioned such that each subregion 62–65 does not overlap any adjacent subregion 62–65 and are exclusive relative to each other. This prevents a defect in the emissive display that happens to be near the intersection of two adjacent subregions 62–65 from being counted twice as a defect.

Figure 5:
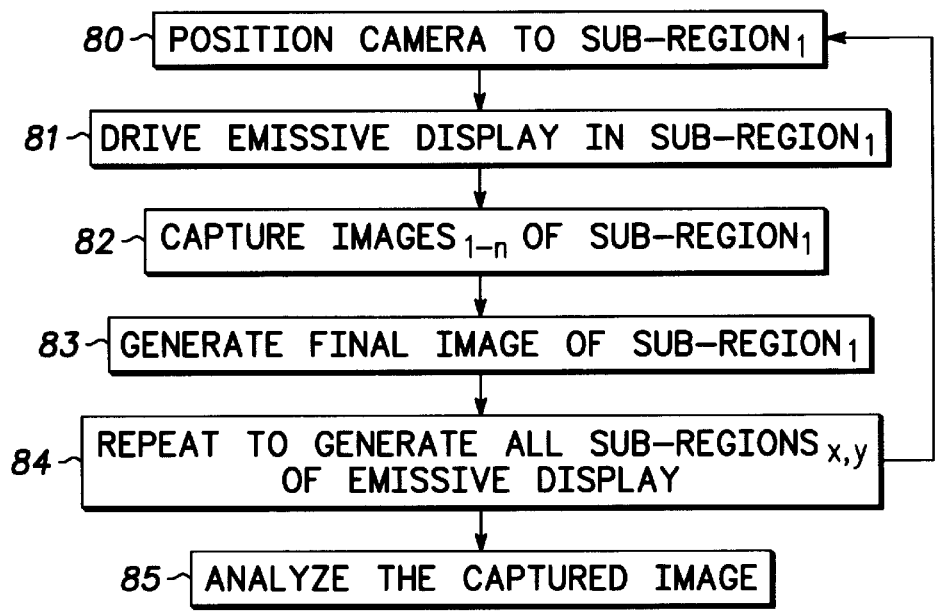
FIG. 5 is a flowchart of a process for testing an electronic component in accordance with the present invention.

FIG. 5 is a flow chart representation of a process of capturing an image from emissive display 61 (see FIG. 4) using image capture device 10 (see FIG. 2). The process begins with box 80. Mirror controls 38 and 39 are adjusted so that only the portion of the image from emissive display 61 in subregion 62 is passed to pickup device 41.

Control device 50 generates control signals and passes them to electronic component 60 through wafer prober 15. The control signals are intended to activate only the portion of emissive display 61 in subregion 62 (box 81). At the same time, control signals are sent to electronic component 60 to deactivate subregions 63–65.

Control device 50 operates image capture device 10 and captures several images (n images) of subregion 62 (box 82). Preferably, the sampling rate of subregion 62 occurs at a slightly lower frequency than the operation of pickup device 41 to prevent the optical illusion of a bar across the image. For example, similar optical illusions occur when the image of a computer monitor is seen on a television screen. Once several images, preferably 3 to 10 images, are captured, a composite image is generated (box 83) using the process described earlier where each pixel of the image is either the brightest or darkest pixel from the images stored during the sampling.

After the composite image for subregion 62 is generated, mirror controls 38 and 39 are manipulated as needed to adjust mirrors 36 and 37 so that image capture device 10 only captures the image generated from subregion 63 of emissive display 61. The image of subregion 63 is then generated in the same manner (boxes 80–83) and this process is repeated until the image of each subregion 62–65 of emissive display 61 is captured (box 84). Once the entire image of emissive display 61 is captured, it is sent to inspection system 20 (see FIG. 1) to determine if the electronic component is operating properly (box 85).

One advantage of image capture device 10 is that an optical directional means (mirrors 36 and 37) is positioned between lens 31 and pickup device 41. This allows pickup device 41 and image capture device 10 to remain still during the testing of an emissive display. This configuration also allows a portion of the image of an emissive display to be captured even if the emissive display has a resolution that is higher than that of pickup device 41.

Therefore, a variety of emissive displays can be tested using the same image capturing device. As the resolution and size of emissive displays increases, the same image capturing device can be used by simply partitioning the emissive display into smaller subregions. This obviates the need to replace pickup device 41 with one having a higher resolution as the resolution of emissive displays improves. This not only saves the expense of the pickup device, but also simplifies the manufacturing operation as the same image capturing device can be used for products that have emissive displays of different sizes. The present invention also provides for the generation of a composite map from several stored images to eliminate noise in either the image capture device or the emissive display under test.

We claim:

1. A method for manufacturing an electronic component having an emissive display comprising the steps of:

providing a wafer having the emissive display formed thereon;

placing the wafer in a wafer prober;

providing an image capture device coupled to the wafer prober, wherein the image capture device has a pickup device;

positioning the emissive display of the wafer within view of the pickup device;

partitioning an image of the emissive display into a first subregion and a second subregion;

activating the first subregion of the emissive display such that the first subregion generates a first image;

deactivating the second subregion of the emissive display;

capturing the first image with the image capture device;

activating the second subregion of the emissive display such that the second subregion generates a second image; and capturing the second image with the image capture device.

2. The method of claim 1 wherein the step of capturing the first image comprises the steps of:

capturing a plurality of images, wherein each image comprises an array of pixels, and generating a composite image from the plurality of images.

3. The method of claim 2 wherein the step of generating the composite image includes the step of determining a maximum intensity value for each pixel in the array of pixels.

4. The method of claim 1 further comprising the step of providing the image capture device having a pickup device, a mirror, and a lens, the mirror being positioned between the pickup device and the lens.

5. The method of claim 1 wherein the step of partitioning the image of the emissive display includes the step of defining the first subregion and the second subregion such that the first subregion and the second subregion are non-overlapping relative to each other.

6. A method of manufacturing an electronic component having an emissive display comprising the steps of:

providing a wafer having the emissive display;

placing the wafer in a wafer prober;

providing an image capturing system having a lens, a plurality of mirrors, and a pickup device, the plurality of mirrors being positioned between the lens and the pickup device, wherein the image capturing system is coupled to the wafer prober;

partitioning the emissive display into a first subregion and a second subregion, wherein both the first subregion and the second subregion have an image;

positioning the plurality of mirrors so that the image of the first subregion is passed to the pickup device of the image capturing system;

activating the first subregion of the emissive display;

deactivating the second subregion of the emissive display;

capturing a plurality of images with the image capturing device; and generating a composite image from the plurality of images.

7. The method of claim 6 wherein each of the plurality of images comprises an array of pixels, each pixel having an intensity value, and the step of generating the composite image includes the step of determining a maximum intensity value for each pixel in the composite image.

8. The method of claim 6 wherein the step of partitioning the image of the emissive display includes the step of defining the first subregion and the second subregion such that the first subregion and the second subregion are exclusive relative to each other.

* * * * *